United States Patent [19]
Khattak et al.

[11] Patent Number: 4,840,699
[45] Date of Patent: Jun. 20, 1989

[54] GALLIUM ARSENIDE CRYSTAL GROWTH

[75] Inventors: Chandra P. Khattak, Danvers; Vernon E. White, Needham; Frederick Schmid, Marblehead; John H. Wohlgemuth, Acton, all of Mass.

[73] Assignee: Ghemini Technologies, Salem, Mass.

[21] Appl. No.: 142,310

[22] Filed: Dec. 28, 1987

Related U.S. Application Data

[63] Continuation of Ser. No. 65,163, Jun. 12, 1987, abandoned, which is a continuation of Ser. No. 779,817, Sep. 25, 1985, abandoned.

[51] Int. Cl.$^4$ ............................................. C30B 11/00
[52] U.S. Cl. ........................ 156/616.41; 156/616.2; 156/616.3; 156/616.4; 156/624
[58] Field of Search .............. 156/616.1, 616.2, 616.3, 156/616.4, 616.41, 601, 620.2, 624, DIG. 81

[56] References Cited

U.S. PATENT DOCUMENTS

| | | | |
|---|---|---|---|
| 3,898,051 | 8/1975 | Schmid | 156/616 |
| 4,404,172 | 9/1983 | Gault | 156/616.2 |
| 4,610,754 | 9/1986 | Gaida et al. | 156/616 R |
| 4,687,538 | 8/1987 | Pastor | 156/616 R |

FOREIGN PATENT DOCUMENTS 2127712  4/1984  United Kingdom ................ 156/617

OTHER PUBLICATIONS

Crystal Growth, Second Edition, Pamplin ed., 1980 vol. 16, pp. 171–174.
Practical Comparison of LEC Production Methods for Si-GaAs, Lane, Semiconductor International, Oct. 1984.
Willardson, R. K., "Crystal Growth of Semi-Insulating Gallium Arsenside," 1984 Semi-Insulating III-V Materials, Kah-nee-ta (Nantwich—Shiva)(1984).
Ghez, R., et al, "Why Not Grow GaAs By Vertical Bridgman?", AACG Newsletter vol. 13, 3, p. 5 (Nov. 1983).
Jordan, A. S., et al, "The Theory and Practice of Dislocation Reduction in GaAs and InP", Journal of Crystal Growth 70 pp. 555–573 (1984).
Press Release of Ghemini Technologies, Jan. 6, 1984.
DiLorenzo, J. V., et al, "Substrate Quality: How Important for Future GaAs ICs?" 1984 Semi-Insulating III-V Materials, Kah-nee-ta (Nantwich: Shiva) (1984).
Kirkpatrick, C. G., et al, "LEC GaAs for Integrated Circuit Applications" from Semiconductors and Semi-Metals (R. K. Willardson and A. C. Beer, eds), vol. 20, Semi-Insulating GaAs (Academic Press (1984) (pp. 159–231).
Thomas, R. V, et al "High-Purity LEC Growth and Direct Implantation of GaAs for Monolithic Circuits," (Academic Press (1984)) pp. 1–87.
Swiggard E. et al, "LEC Growth of Undoped Semi-Insulating GaAs", at the Naval Research Laboratories,: AACG Newsletter vol. 18, 1 (American Association for Crystal Growth) Mar. 1988, p. 3.

Primary Examiner—John Doll
Assistant Examiner—Lori S. Freeman
Attorney, Agent, or Firm—Hale and Dorr

[57] ABSTRACT

A process that, without doping of PBN crucibles, produces semi-insulating GaAs having low, or essentially no, dislocation density; and in which the crystal may be in situ annealed after growth. The process is a variant of the Heat Exchanger Method (HEM) disclosed in U.S. Pat. No. 3,898,051. Crack-free, semi-insulating GaAs crystals having low dislocation density are grown from presynthesized undoped GaAs meltstock in sealed quartz (vitreous silica) crucibles, without the need for an encapsulant. One aspect of the invention features seeded growth of <100> orientation crystals having a dislocation density 1-2 orders of magnitude less than that of the seed; in another aspect, crystals having fewer than 500 dislocations/cam$^2$ in their center column are grown without a seed.

12 Claims, 1 Drawing Sheet

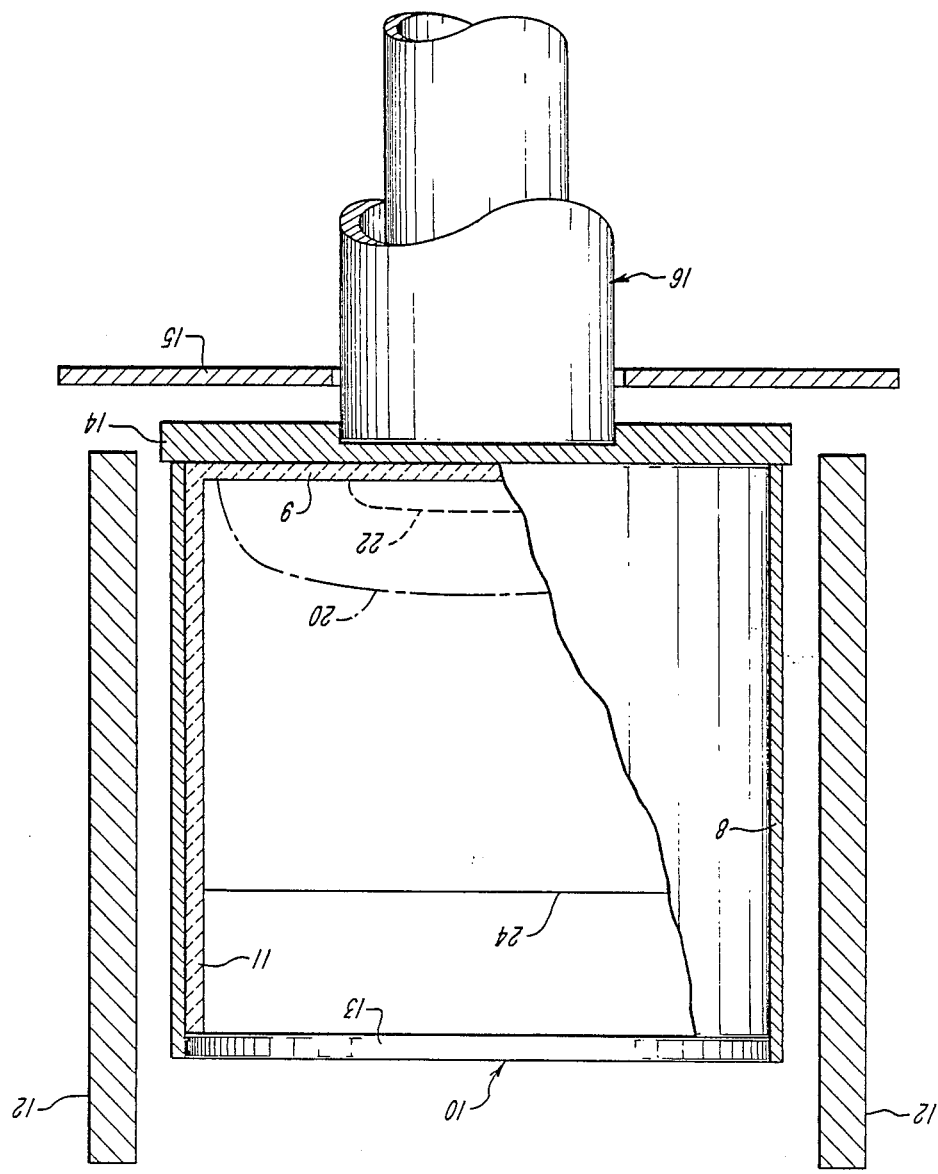

GALLIUM ARSENIDE CRYSTAL GROWTH

This is a continuation of co-pending application Ser. No. 065,163 filed on June 12, 1987 now abandoned which is a continuation of application Ser. No. 779,817 filed Sept. 25, 1985 now abandoned.

This invention relate to the growth of gallium arsenide.

BACKGROUND OF THE INVENTION

Large semi-insulating gallium arsenide (GaAs) wafers with low dislocation density are required for the next generation of very high-speed integrated circuits. There is a current lack of availability of GaAs substrates with low dislocation density, particularly undoped, semi-insulating, and of size comparable to that of silicon wafers.

The GaAs growth techniques generally utilized in industry are Horizontal Bridgman (HB) growth and Liquid Encapsulated Czochralski (LEC) growth. Vertical Bridgman growth has never proved commercially practical, among other reasons because of crystal cracking.

Horizontal Bridgman growth typically proceeds from presynthezide GaAs in a sealed crucible or ampoule, and in commercial practice typically produces crystals having dislocation densities (etch pit densities) somewhat less than $10^4$ (e.g., about 5,000) dislocations per square centimeter. However, HB growth results in D-shaped ingots making it difficult to obtain wafers as large as 3 inches in diameter; further the HB process usually produces <111> oriented crystals, which must be sliced off-axis to obtain wafers having the desired <100> orientation. HB wafers often also exhibit silicon contamination and, if uniform semi-insulating properties are to be achieved, must be doped with chromium. This presents further problems since chromium often migrates (redistributes) during subsequent processing, thus degrading performance.

LEC-grown GaAs has more consistent semi-insulating properties, but higher (typically greater than $5 \times 10^4$ per $cm^2$) dislocation densities. To obtain consistent semi-insulating properties, it is also generally necessary to grow the crystals in expensive pyrolitic boron nitride (PBN) crucibles. To reduce dislocation density, efforts have been made to reduce temperature gradients, the melt has been doped with indium, and an extra thick boron oxide encapsulant layer has been used; none of these attempts have been particularly successful since each causes its own complications.

There is, in the industry, a need for a process that can consistently produce crack-free, semi-insulating GaAs having low dislocation densities.

SUMMARY OF THE INVENTION

This invention provides a process that, without need for doping or expensive PBN crucibles, can commercially produce semi-insulating GaAs having low, or essentially no, dislocation density; and in which the crystal may be in situ annealed after growth. The process is a variant of the Heat Exchanger Method (HEM) disclosed in U.S. Pat. No. 3,898,051, which patent is here incorporated by reference. According to the present invention, crack-free, semi-insulating GaAs crystals having low dislocation density are grown from presynthesized undoped GaAs meltstock in sealed quartz (vitreous silica) crucibles, without the need for an encapsulant. One aspect of the invention features seeded growth of <100> orientation crystals having a dislocation density 1-2 orders of magnitude less than that of the seed; in another aspect, crystals having fewer than 500 dislocations/$cm^2$ in their center column are grown without a seed.

DESCRIPTION OF DRAWING

The drawing is a plan, somewhat schematic, view of a system used in the practice of the present invention.

DETAILED DESCRIPTION OF PREFERRED EMBODIMENT

Referring now to the drawing, it illustrates a cylindrical silica crucible 10 (inside diameter 5.5 cm.) within the cylindrical heating chamber defined by the resistance heater 12 of a casting furnace of the type disclosed in U.S. Pat. No. 3,898,051. The top of the crucible is sealed by a cover plate 13, and the crucible sides 11 are supported by a surrounding cylindrical graphite retainer 8. The crucible 10 sits on a graphite support plate 14 spaced above the bottom 15 of the heating chamber. A helium-cooled molybdenum heat exchanger 16, of the type disclosed in U.S. Pat. No. 3,653,432 which is here incorporated by reference, extends through an opening in the bottom 15 of the heating chamber into a cylindrical vertical recess in the bottom of graphite plate 14. The top of the heat exchanger (1 inch in diameter) is coaxial with, and about ⅛ inch below, the bottom 9 of crucible 10.

A GaAs ingot, partially solidified according to the process of the present invention, is shown within the crucible 10. The solid liquid interface 20 has advanced from the seed (shown in dashed lines at 22). Since the crucible 10 is sealed, the As vapor in the space between the top 24 of the melt and the cover 13 of the crucible is held under pressure as required to maintain the desired stoichiometric ratio.

According to the practice of the present invention, a seed 22 [<100> orientation; diameter slightly greater than 1 inch] was placed in the center bottom of the crucible 10 and the crucible filled with presynthesized GaAs meltstock, without disturbing the seed location. Cover 13 was then sealed in place and the sealed crucible placed in position in the furnace heating chamber. The furnace was then turned on, and the temperature raised to about 1270° C. (about 30° above the 1238° C. melting point of GaAs).

During melting, cold helium is flowed through the heat exchanger 16, thus cooling the bottom of the crucible and preventing seed 22 from melting. The bottom of the seed reacts with the crucible bottom, causing the seed to adhere to the crucible and preventing it from floating in the melt.

After melting is complete, the gas flow through the heat-exchanger is gradually increased, to initiate crystal growth; and thereafter both the temperature at the top of the heat-exchanger and the temperature of the crucible side walls ar independently controlled (the former by varying flow through the heat-exchanger; the latter by varying the power applied to the resistance heater) to provide the necessary growth rate and temperature gradients.

During growth, the temperatures at the top of the heat exchanger, and at the bottom of the crucible are held well below the melt point. The bottom of the crucible is preferably maintained below about 1000° C. The crucible side wall temperature, on the other hand, initially is about 1270° C. (about 30° C. over the melt point of GaAs). In the disclosed embodiment, the diameter of crucible 10 is about 5.5 cm. and that of the seed is about 2.4 cm. The maximum initial temperature gradient in the liquid GaAs, thus, is not more than about 21° C./cm [(1270°−1238° C.)/1.55 cm], and in most of the liquid GaAs it is considerably less. In the solid GaAs, the temperature gradients are much higher.

The flow of gas through the heat exchanger and application of heat to the crucible side walls are controlled so that solidification will be complete in about 20 hours or less. The superheat (i.e., heat over the melt point) is kept low so that, except in the portion of the melt closely adjacent the cylindrical walls of the crucible, the temperature gradients within the liquid portion of the melt (principally the portion above the solid-liquid interface 20) and the top and sides of the crucible) does not exceed 10° C.−30° C. per centimeter. When the temperature gradients are maintained at the proper low levels, the solid-liquid interface will be convex to the liquid portion of the melt and will have a configuration similar to the slightly-convex-top-generally-cylindrical side shape shown in the drawing. As there indicated, most of the curvature in the interface is near the intersection of the top and sides. The exact configuration of the interface in any particular growth run can be determined by slicing the resulting ingot. It has been found that a too-flat interface results in insufficient rejection of impurities (including silica) to the sides of the ingot. If, on the other hand, the interface is too convex, e.g., hemispherical, the temperature gradients within the ingot typically will have been too high to produce the desired low dislocation density.

Unlike in vertical Bridgman growth, there is no significant attachment of the ingot to the wall, and cracking of the ingot is thus avoided.

After growth is completed, the GaAs ingot is in situ annealed just below the solidification temperature, and thereafter slowly cooled to room temperature. This anneal and cooldown cycle assists in controlling point defect density and, hence, EL2 concentration, electrical properties and dislocation density. Typically, annealing is accomplished by decreasing the rate of helium flow through the heat exchanger, after solidification is completed, thereby raising the temperature of the entire ingot to 1100° C.−1230° C.; and then permitting the ingot slowly to cool to room temperature, e.g., over a several day period.

The present invention has produced crack-free semi-insulating, GaAs crystal 5.5 cms. in diameter and 5.5. cm. high weighing about 700 gm. Single GaAs <100> orientation crystals grown from <100> orientation seed have shown uniform etch pit density (EPD) of $1-2 \times 10^4$ per square centimeter throughout. In an unseeded growth, a <211> single crystal having a EPD less than 500 cm$^{-2}$ for the central 2.5 cm. column was produced. The crystals are semi-insulating (resistivity at 340° K. of approximately $10^8$ ohm-cm), and the variations of carrier concentration and EL2 concentration across a 5 cm. diameter wafer do not exceed plus-or-minus about 5% and 8%, respectively The absolute value of EL2 concentration measured was $(4-6) \times 10^{16}$ cm$^{-3}$, 3 to 10 times larger than in typical LEC GaAs and 2 to 3 times larger than in typical HB crystals.

What is claimed is:

1. A process for growing semi-insulating gallium arsenide ingots in a sealed silica crucible comprising the steps of:

providing a silica crucible, placing gallium arsenide meltstock in said crucible, raising the temperature of said crucible to a temperature above the melt point of said meltstock and maintaining said temperature above said melt point for a length of time sufficient to melt said meltstock, and thereafter directionally solidifying said meltstock by withdrawing heat from the center bottom portion of said crucible while simultaneously applying heat to the side walls of said crucible, the temperature of the center bottom of said crucible being maintained below the melt point and the temperature of the upper portion of the side walls of said crucible being maintained above said melt point until substantially all of said meltstock has been solidified, wherein:

no encapsulant is placed within said crucible;

said crucible is sealed with a silica cover plate after said gallium arsenide is placed therein; and, said withdrawing and said applying are independently controlled such that the interface between solidified gallium arsenide and liquid gallium arsenide is convex to the liquid and advances outwardly and upwardly from said center bottom portion, and the temperature gradients within the liquid portion of said gallium arsenide are maintained sufficiently low such that said solidified meltstock forms an ingot that, except adjacent the sides thereof, is crack-free.

2. The process of claim 1 wherein said meltstock is undoped.

3. The process of claim 1 wherein the temperature of said center bottom portion is maintained below about 1000° C. during solidification.

4. The process of claim 1 wherein said ingot has a dislocation density that, except adjacent the outer surface thereof, is not more than about $2 \times 10^4$ dislocations per square centimeter.

5. The process of claim 1 including the step of placing a <100> orientation seed adjacent the center bottom of said crystal, and including the step of withdrawing heat from the center bottom portion of said crucible while melting said meltstock, thereby preventing melting and floating of said seed during said melting.

6. The process of claim 1 wherein said ingot is <100> orientation.

7. The process of claim 1 wherein at least the central portion of said ingot has a dislocation density not more than about 1000 dislocations per square centimeter.

8. The process of claim 5 wherein said ingot, except adjacent the outer surface thereof, has a dislocation density not more than about $2 \times 10^4$ dislocations per square centimeter.

9. The process of claim 1 wherein said ingot is circular in cross-section.

10. The process of claim 1 including the step of annealing said ingot prior to removing said crucible or said ingot from said furnace.

11. The process of claim 10 including the step of annealing said ingot prior to reducing the temperature of said ingot to room temperature.

12. The process of claim 10 including the step of annealing said ingot by permitting the temperature of said center bottom portion of said crucible to increase, and, after the temperature of the entire ingot is between 1100° C., slowly decreasing the temperature of said ingot to room temperature.

* * * * *